United States Patent [19]

Banerji et al.

[11] Patent Number: 5,203,076

[45] Date of Patent: Apr. 20, 1993

[54] VACUUM INFILTRATION OF UNDERFILL MATERIAL FOR FLIP-CHIP DEVICES

[75] Inventors: Kingshuk Banerji, Plantation; Francisco D. Alves, Boca Raton; Robert F. Darveaux, Coral Springs, all of Fla.

[73] Assignee: Motorola, Inc., Schaumburg, Ill.

[21] Appl. No.: 812,332

[22] Filed: Dec. 23, 1991

[51] Int. Cl.$^5$ ............................................. H05K 3/34
[52] U.S. Cl. ........................................ 29/840; 156/901; 174/260; 428/901
[58] Field of Search ......................... 29/840, 830, 831; 156/901; 428/901; 174/260

[56] References Cited

U.S. PATENT DOCUMENTS

| | | | |
|---|---|---|---|
| 4,604,644 | 8/1986 | Beckham et al. | 29/840 X |
| 4,940,181 | 7/1990 | Juskey, Jr. et al. | |
| 5,019,673 | 5/1991 | Juskey et al. | |

FOREIGN PATENT DOCUMENTS 1-191457  8/1989  Japan .

OTHER PUBLICATIONS

IBM Tech Disclosure Bull., vol. 23, No. 5, Oct. 1980, pp. 1877–1878.
IBM Tech Disclosure Bull., vol. 32, No. 10B, Mar. 1990, p. 480.
IBM Tech Disclosure Bull., vol. 29, No. 11, Apr. 1987, pp. 4718–4719.

*Primary Examiner*—Carl J. Arbes
*Attorney, Agent, or Firm*—Juliana Agon

[57] ABSTRACT

A method of attaching an integrated circuit (10) to a substrate (20) starts with electrically interconnecting (14) the integrated circuit on the substrate. Next, a bead of underfill material (22) is provided on the substrate (20) about the periphery (24) of the integrated circuit (10). At least a partial vacuum (34) is then applied to the integrated circuit (10) and the substrate (20) to substantially evacuate the area (18) between the integrated circuit (10) and the substrate (20). Finally, fluid pressure (42) is applied to the integrated circuit (10) and the substrate (20) to force at least a portion of the underfill material (22) into the area (18) between the integrated circuit (10) and the substrate (20).

10 Claims, 2 Drawing Sheets

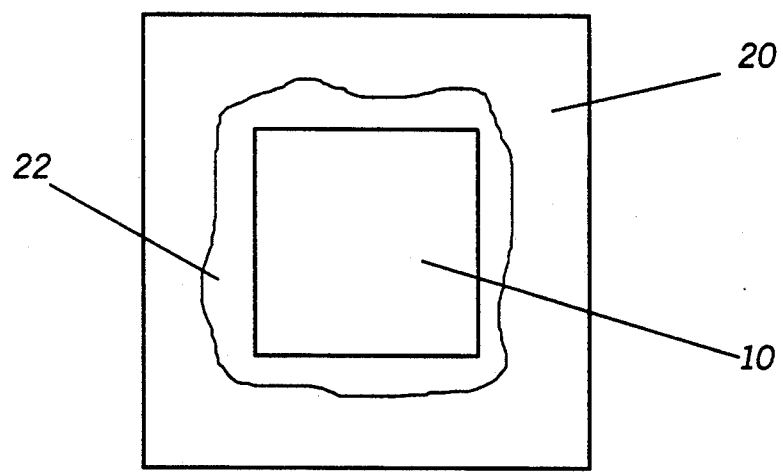

VACUUM INFILTRATION OF UNDERFILL MATERIAL FOR FLIP-CHIP DEVICES

TECHNICAL FIELD this invention relates generally to mounting methods and more particularly to a method of mounting an integrated circuit to a substrate.

BACKGROUND

A bumped integrated circuit (bumped IC) which carries a solder pad arrangement on the top surface (to be conventionally wire-bonded) is turned upside down, (i.e. flipped), allowing direct coupling between the pads and matching contacts directly on a substrate. This use of solder bumps or pads on the underside of the chip is well known in the art. The flip-chip is then aligned to the substrate and all connections are made simultaneously by reflowing the solder. Due to the presence of the solder bumps, gaps exist between the substrate and the bottom surface of the flip-chip or flip-chip chip carrier where the solder bumps are not present.

Hence, to increase mechanical integrity and reliability, a filled polymer between the substrate and the flip-chip bonded IC can be used to fill the gaps. In one known method, a filled polymer is dispensed onto adjacent sides of the bonded flip-chip IC. The liquid polymer then is "sucked into" the gap by capillary action. The duration of flow incurs in an excessively long cycle time of five to twenty minutes. The fillet formed on the two sides on which the polymer is dispensed, is substantially larger than the other two sides. A non-symmetric fillet geometry thus formed produces stress gradients leading to premature failures. This inability to provide a uniform fillet has frustrated attempts to provide flip-chip mounting techniques that are reliable in a mass production environment utilizing in-line automation, repeatable automatic process control, high through-put productions of flip-chips on substrates such as printed circuit (PC) boards, flip-chip multi-chip modules, or carriers to form flip-chip chip carriers, and high productions of flip-chip chip carriers on the PC board, in special applications. Accordingly, a need exists in the art to provide a uniform fillet in a manner that avoids the difficulties of prior infiltration methods.

SUMMARY OF THE INVENTION

Briefly, according to the invention, a method of attaching an integrated circuit to a substrate starts with electrically interconnecting the integrated circuit on the substrate. Next, a bead of underfill material is provided on the substrate about the periphery of the integrated circuit. At least a partial vacuum is then applied to the integrated circuit and the substrate to substantially evacuate the area between the integrated circuit and the substrate. Finally, fluid pressure is applied to the integrated circuit and the substrate to force at least a portion of the underfill material into the area between the integrated circuit and the substrate.

BRIEF DESCRIPTION OF THE DRAWINGS

FIG. 4 is a top view of the solder-bumped flipped IC and the substrate of FIG. 1.

DETAILED DESCRIPTION OF THE PREFERRED EMBODIMENT

Figure 1:
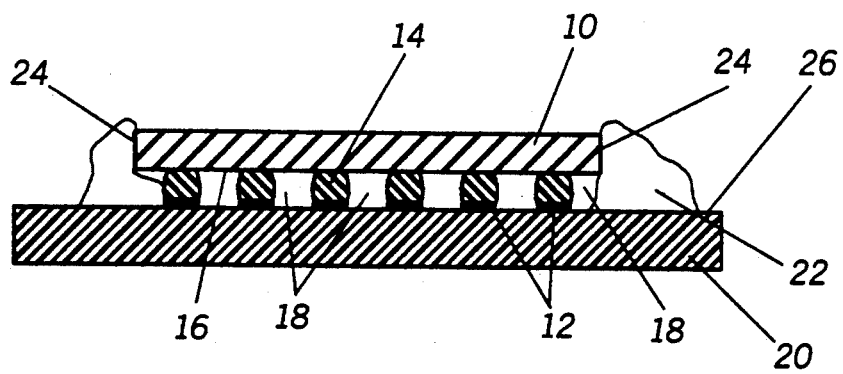
FIG. 1 is a cross-sectional view of an underfill dispensing step for a solder-bumped flipped IC and a substrate in accordance with the present invention.

Referring to FIG. 1, a semiconductor device 10, such as a flip-chip integrated (IC) device, a flip-chip chip carrier, (or other member) as described in U.S. Pat. No. 5,019,673 and hereby incorporated by reference, is shown mounted on a substrate 20. An example of a substrate 20 is a printed circuit (PC) board, as described in U.S. Pat. No. 4,940,181, and hereby incorporated by reference, a flip-chip multi-chip module, or a carrier to form a flip-chip chip carrier. In some special applications, where the flip-chip may not need to be repaired, the flip-chip chip carrier (optionally represented as member 10) may also be mounted on the PC board, according to the present invention. A plurality of hemispherical cavities or flat contact pads 12 on top (26) of the substrate 20 are normally arranged in a square or other geometric pattern suitable to receive the corresponding solder-bumped chip carrier or flip-chip IC 10, or the like. Each of the cavities or contact pads 12 is metallized so as to become solderable and electrically conductive to provide the electrical interconnection between the integrated circuit (IC) 10 and the substrate 20. The solder-bumped chip (or other member) 10 includes a plurality of solder bumps 14 formed on the underside, or the bottom surface 16, of the flip-chip device 10. As can be seen in FIG. 1, with this mounting arrangement, a plurality of gaps 18 is formed between the top surface 26 of the substrate 20 and the bottom surface 16 of the flip-chip device 10 which varies from 2-6 mils.

To fill this gap 18, a continuous feed of an underfill material or an infiltrant 22 is dispensed all around the periphery (all four sides 24) of the flip-chip device 10 as seen in FIG. 4. The infiltrant comprises a polymer of suitable viscosity. However, it must be insured that the underchip volume is completely sealed by the polymer infiltrant 22 such that the sides 24 of the flip-chip 10 make contact with the bead of underfill material 22 which is extending from the top surface 26 of the substrate 20.

Figure 2:
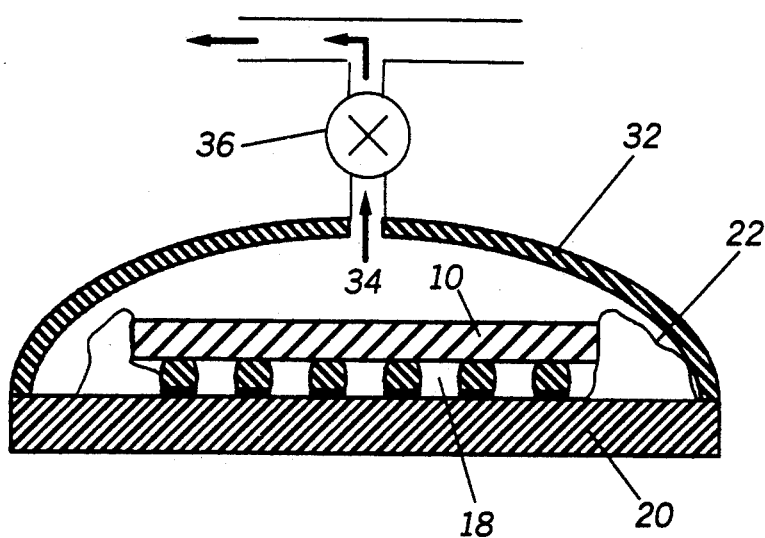
FIG. 2 is a cross-sectional view of a vacuum application step for the solder-bumped flipped IC and substrate of FIG. 1.

Referring to FIG. 2, a vacuum chamber 32 is then positioned over the chip 10, the substrate 20, and the underfill material 22. Vacuum 34 is continuously applied as controlled by a valve 36 and entrapped air that was in the underchip area, or gaps 18, is evacuated by bubbling through the polymer infiltrant 22.

Figure 3:
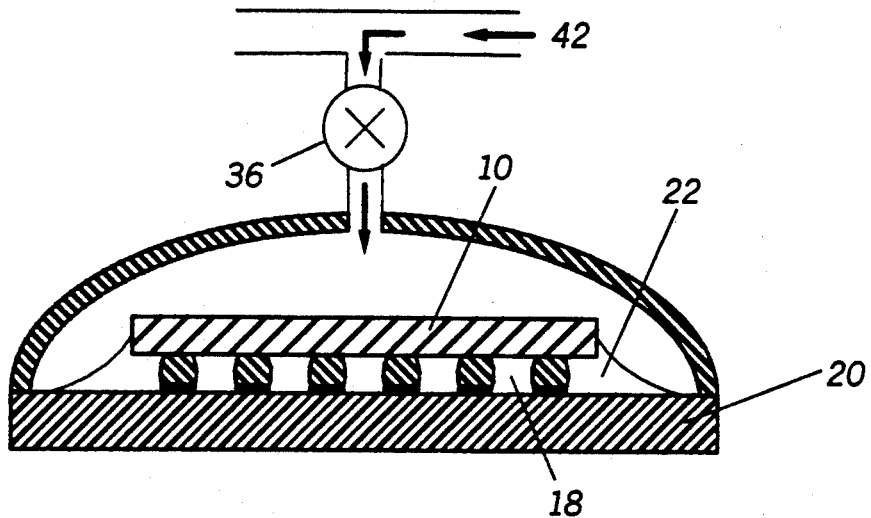
FIG. 3 is a cross-sectional view of an air pressure application step for the solder-bump flipped IC and substrate of FIG. 1.

Referring to FIG. 3, air 42 is now allowed into the vacuum chamber 32 at a controlled rate for a continuous flow as provided by the control valve 36. The fluid or atmospheric pressure of air forces the polymer infiltrant 22 into the underchip area, or gaps 18, and completely fills them without any voids. Typically, the above process steps are conducted over a hot plate to reduce the viscosity of the polymer infiltrant 22 such that it will flow more easily. However, it is conceivable that future underfill materials might have low enough viscosities at room temperatures so that the hot plate may not be necessary. With the above steps, in accordance with the invention, the total infiltration time may be reduced to about 50 seconds.

In summary, vacuum and air pressure is applied to infiltrate the underchip area of a flip-chip device. This process enables the underchip with the filled polymer to result in a reduced infiltration cycle time and eliminates any voids in the infiltrated volume by providing a uniform fillet on all four sides of the flip-chip IC. Additionally, the sequential application of vacuum and air pressure, also lends itself to in-line automation, repeatable automatic process control, and high through-put production of flip-chips of flip-chip chip carriers on any suitable substrate.

What is claimed is:

1. A method of attaching a semiconductor device to a substrate not having a through-hole, comprising the steps of:

electrically interconnecting the semiconductor device on the substrate;

providing a bead of underfill material on the substrate about the periphery of the semiconductor device;

applying at least a partial vacuum to the semiconductor device and the substrate to substantially evacuate entrapped air in the underchip area between the semiconductor device and the substrate by bubbling the entrapped air through the underfill material;

releasing the vacuum by applying fluid pressure to the semiconductor device and the substrate to force at least a portion of the underfill material into the underchip area between the semiconductor device and the substrate.

2. The method of claim 1 wherein the applying at least a partial vacuum step comprises positioning a vacuum chamber over the top of the semiconductor device, the underfill material, and the substrate.

3. The method of claim 1 wherein the applying at least a partial vacuum step comprises controlling the rate of the vacuum to provide a continuous evacuation rate.

4. The method of claim 1 wherein the applying fluid pressure step comprises controlling the rate of the fluid pressure to provide a continuous evacuation rate.

5. The method of claim 1 wherein the applying fluid pressure step comprise applying air pressure.

6. The method of claim 1 wherein the method comprises attaching a flip-chip to the substrate.

7. The method of claim 1 wherein the providing a bead of underfill material step comprises providing a continuous bead of underfill material extending from the substrate to all the sides of the semiconductor device.

8. The method of claim 1 wherein the method comprises attaching a flip-chip chip carrier to a substrate.

9. A method of attaching a flip-chip bonded integrated circuit to a substrate not having a through-hole, comprising the steps of:

electrically interconnecting the flip-chip bonded integrated circuit on the substrate;

providing a bead of underfill material on the substrate about the periphery of the integrated circuit;

applying at least a partial vacuum to the integrated circuit and the substrate to substantially evacuate entrapped air in the underchip area between the integrated circuit and the substrate by bubbling the entrapped air through the underfill material; and releasing the vacuum by applying fluid pressure to the integrated circuit and the substrate to force at least a portion of the underfill material into the underchip area between the integrated circuit and the substrate.

10. A method of attaching a flip-chip bonded integrated circuit to a printed circuit board not having a through-hole in the area of flip-chip bonding, comprising the steps of:

electrically interconnecting the flip-chip bonded integrated circuit on the printed circuit board;

providing a bead of underfill material on the printed circuit board about the periphery of the integrated circuit;

applying at least a partial vacuum to the integrated circuit and the printed circuit board to substantially evacuate entrapped air in the underchip area between the integrated circuit and the printed circuit board by bubbling the entrapped air through the underfill material; and releasing the vacuum by applying air pressure to the integrated circuit and the printed circuit board to force at least a portion of the underfill material into the underchip area between the integrated circuit and the printed circuit board.

* * * * *